(12) United States Patent
Xiang et al.

(10) Patent No.: US 11,333,691 B2
(45) Date of Patent: *May 17, 2022

(54) POWER MODULES HAVING CURRENT SENSING CIRCUITS

(71) Applicant: Astec International Limited, Kowloon (HK)

(72) Inventors: Mao Xi Xiang, Shenzhen (CN); Jian Feng Lv, Shenzhen (CN); Chen Chen Zheng, Shenzhen (CN); Qian Feng, Shenzhen (CN)

(73) Assignee: Astec International Limited, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 16/952,292

(22) Filed: Nov. 19, 2020

(65) Prior Publication Data

US 2021/0072294 A1 Mar. 11, 2021

Related U.S. Application Data

(63) Continuation of application No. 15/753,492, filed as application No. PCT/CN2016/091809 on Jul. 26, 2016, now Pat. No. 10,877,079.

(51) Int. Cl.
*G01R 19/32* (2006.01)
*H02J 1/00* (2006.01)
(Continued)

(52) U.S. Cl.
CPC ....... *G01R 19/32* (2013.01); *G01R 19/16576* (2013.01); *G01R 31/2801* (2013.01);
(Continued)

(58) Field of Classification Search
CPC ................ G01R 19/32; G01R 31/2801; G01R 19/16576; H02J 1/00; H01C 7/008;
(Continued)

(56) References Cited

U.S. PATENT DOCUMENTS 6,028,426 A 2/2000 Cameron et al.
6,980,447 B1* 12/2005 Schaible ........... H02M 3/33592
363/56.05
(Continued)

FOREIGN PATENT DOCUMENTS

CN 101398446 A 4/2009
CN 101650381 A 2/2010
(Continued)

OTHER PUBLICATIONS

Spaziani, Larry; Using Copper PCZBZ Etch for Low Value Resistance; Texas Instruments; 2001; 4 pages.

*Primary Examiner* — Dharti H Patel

(57) ABSTRACT

According to some aspects of the present disclosure, power modules having current sensing circuits, and corresponding sensing methods, are disclosed. Example power modules include a printed circuit board (PCB) having a PCB trace, a first sense terminal coupled to the PCB trace at a first location, and a second sense terminal coupled to the PCB trace at a second location such that a resistance between the first and second sense terminals is defined by a resistance of the PCB trace between the first location and the second location. The power module further comprises a control coupled to the first sense terminal and the second sense terminal, the control adapted to measure a voltage between the first sense terminal and the second sense terminal and determine a current through the PCB trace based on the measured voltage and the resistance between the first sense terminal and the second sense terminal.

20 Claims, 4 Drawing Sheets

(51) Int. Cl.
*G01R 31/28* (2006.01)
*G01R 19/165* (2006.01)
*H01C 7/00* (2006.01)
*H02H 1/00* (2006.01)
*H02H 9/02* (2006.01)
*H05K 1/02* (2006.01)
*H05K 1/11* (2006.01)
*H05K 1/18* (2006.01)
*H02M 1/00* (2006.01)

(52) U.S. Cl.
CPC ........... *H01C 7/008* (2013.01); *H02H 1/0007* (2013.01); *H02H 9/02* (2013.01); *H02J 1/00* (2013.01); *H05K 1/0213* (2013.01); *H05K 1/115* (2013.01); *H05K 1/181* (2013.01); *H02M 1/0009* (2021.05); *H05K 2201/1003* (2013.01); *H05K 2201/10022* (2013.01); *H05K 2201/10151* (2013.01)

(58) Field of Classification Search
CPC ...... H02H 1/0007; H02H 9/02; H05K 1/0213; H05K 1/115; H05K 1/181; H05K 2201/10022; H05K 2201/1003; H05K 2201/10151; H02M 2001/0009
USPC .......................................................... 361/87
See application file for complete search history.

(56) References Cited

U.S. PATENT DOCUMENTS

| 10,877,079 B2* | 12/2020 | Xiang | G01R 31/2801 |
| 2014/0167740 A1 | 6/2014 | Gilbert | |
| 2015/0062768 A1* | 3/2015 | Prescott | H02M 1/32 |
| | | | 361/86 |
| 2017/0317598 A1* | 11/2017 | Ptacek | H02M 1/08 |

FOREIGN PATENT DOCUMENTS

| CN | 203101479 U | 7/2013 |
| CN | 205355795 U | 6/2016 |
| JP | 2011089903 A | 5/2011 |

* cited by examiner

POWER MODULES HAVING CURRENT SENSING CIRCUITS

CROSS-REFERENCE TO RELATED APPLICATIONS

This application claims the benefit of and priority to U.S. application Ser. No. 15/753,492 filed Feb. 19, 2018, which claims the benefit of and priority to PCT/CN2016/091809 filed Jul. 26, 2016. The entire disclosures of the above applications are incorporated herein by reference.

FIELD

The present disclosure relates to power modules having current sensing circuits, and corresponding sensing methods.

BACKGROUND

This section provides background information related to the present disclosure which is not necessarily prior art.

Many power modules use different approaches for sensing current in the power module, including current sensing transformers, alternating current (AC) sensors, output choke direct current resistance (DOR), shunt resistors, etc. High density, high power, space restricted power modules often require small footprint components for current sensing in order to increase available space for other components of the power module.

SUMMARY

This section provides a general summary of the disclosure, and is not a comprehensive disclosure of its full scope or all of its features.

According to one example embodiment of the present disclosure, a power module comprises a printed circuit board (PCB) having a PCB trace, a first sense terminal coupled to the PCB trace at a first location, and a second sense terminal coupled to the PCB trace at a second location distinct from the first location such that a resistance between the first sense terminal and the second sense terminal is defined by a resistance of the PCB trace between the first location and the second location. The power module further comprises a control coupled to the first sense terminal and the second sense terminal, the control adapted to measure a voltage between the first sense terminal and the second sense terminal and determine a current through the PCB trace based on the measured voltage and the resistance between the first sense terminal and the second sense terminal.

According to another example embodiment of the present disclosure, a power module comprises a printed circuit board (PCB) having a PCB trace, a first sense terminal coupled to a first location of the PCB trace, and a second sense terminal coupled to a second location of the PCB trace such that a resistance between the first sense terminal and the second sense terminal is defined by a resistance of the PCB trace. The power module further comprises a control coupled to the first sense terminal and the second sense terminal, the control adapted to determine a current through the PCB trace based on a measured voltage between the first sense terminal and the second sense terminal and based on the resistance between the first sense terminal and the second sense terminal. The power module also comprises a temperature compensation circuit coupled to the control, the temperature compensation circuit adapted to adjust an overcurrent protection threshold of the power module based on a measured ambient temperature to compensate for changes in the resistance between the first sense terminal and the second sense terminal based on temperature.

According to yet another example embodiment of the present disclosure, method of sensing a current sensing using a current sensing circuit, the current sensing circuit having a first sense terminal coupled to a printed circuit board (PCB) trace on a PCB of a power module and having a second sense terminal coupled to the PCB trace such that a resistance between the first sense terminal and the second sense terminal is defined by the resistance of the PCB trace. The method comprises measuring a voltage between the first sense terminal and the second sense terminal and determining a current through the PCB trace based on the measured voltage and the resistance between the first sense terminal and the second sense terminal.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Figure 1:
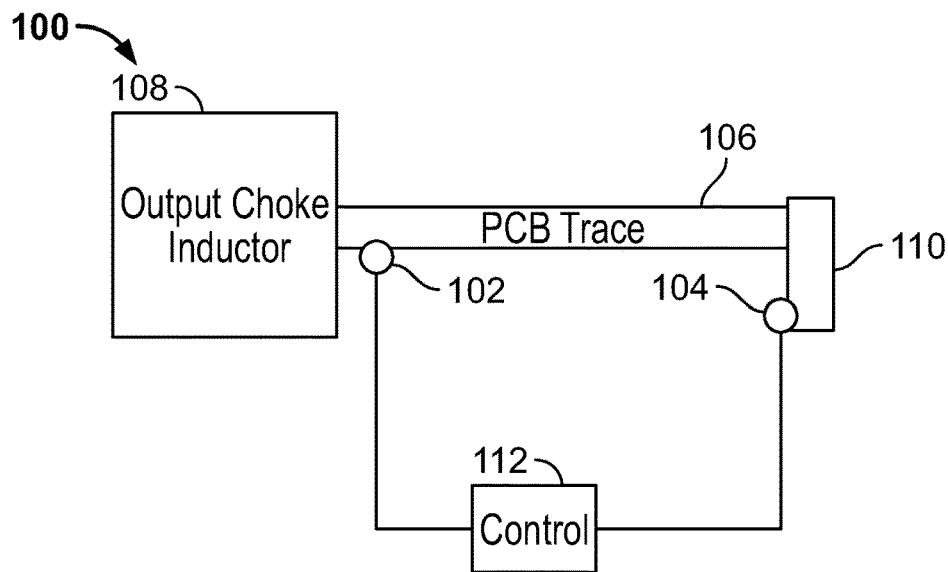
FIG. 1 is a block diagram of an example non-dissipative current sensing circuit according to one embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. R will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A power module according to one example embodiment of the present disclosure is illustrated in FIG. 1 and indicated generally by reference number 100. As shown in FIG. 1, the power module 100 includes a first sense terminal 102 coupled to a printed circuit board (PCB) trace 106 on a PCB of a power module. The PCB trace 106 is coupled to an output choke inductor 108 mounted to the PCB.

A second sense terminal 104 is coupled to an output pin 110 of the PCB power module. The output pin 110 is connected to the PCB trace 106. Accordingly, a resistance between the first sense terminal 102 and the second sense terminal 104 is defined by the resistance of the PCB trace 106 and the resistance of the output pin 110.

The power module 100 also includes a control 112 coupled to the first sense terminal 102 and the second sense terminal 104. The control 112 is adapted to measure a voltage between the first sense terminal 102 and the second sense terminal 104. The control 112 is adapted to determine a current through the PCB trace 106 and the output pin 110 based on the measured voltage between the first sense terminal 102 and the second sense terminal 104, and the resistance between the first sense terminal and the second sense terminal.

Accordingly, the control 112 can use the sensed voltage between the first sense terminal 102 and the sense terminal 104 to determine a current through the output choke inductor 108, because the output choke inductor is coupled to the PCB trace 106 and the output pin 110.

The current sensing circuit (e.g., sense terminals 102, 104 and control 112) of power module 100 is similar to a traditional shunt resistor current sensing circuit, but may not require a shunt resistor. The power module 100 uses the resistance defined between the first sense terminal 102 and the second sense terminal 104 (i.e. the resistance of the PCB trace 106 and the output pin 110) to determine a current of the output choke inductor 108.

The current sensing circuit of the power module 100 can be considered substantially non-dissipative (e.g., minimally dissipative, etc.) because the current sensing circuit may not introduce any additional resistances to the current path of the power module, thereby increasing efficiency of the power module. For example, the current sensing circuit may provide reduced power dissipation (e.g., a reduction of about 0.5 W, etc.) compared to traditional current sensing topologies.

The current sensing circuit may comprise less space on the PCB as compared to traditional current sensing circuits, thereby increasing available space for other components of the power module (e.g., allow for larger semiconductors, gate drivers, power transformers, output chokes, input and output capacitors, etc.).

Figure 2:
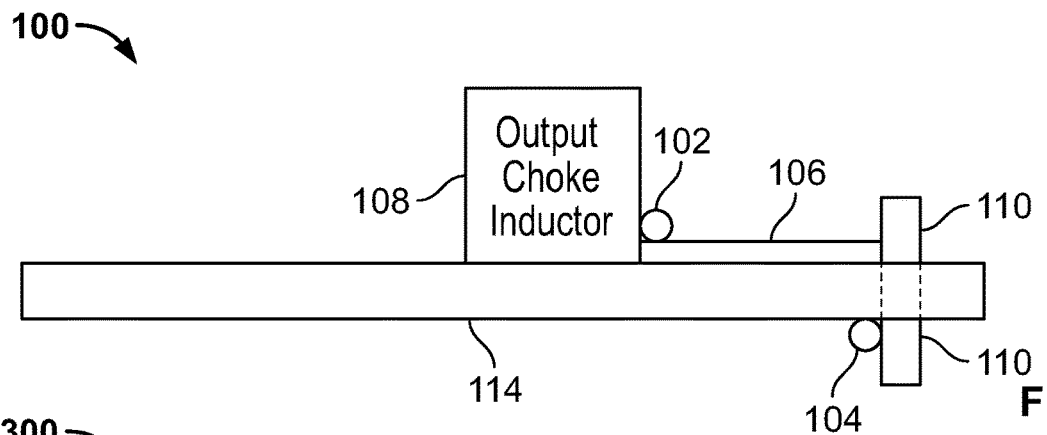
FIG. 2 is a side view of the circuit of FIG. 2 disposed on a printed circuit board (PCB).

FIG. 2 illustrates a side view of the power module 100 including a PCB 114. As shown in FIG. 2, the output choke inductor 108 and PCB trace 106 are disposed on a top side of the PCB 114. The first sense terminal 102 is also disposed on the top side of the PCB 114.

The output pin 110 is a through hole output pin extending through the PCB 114 to couple the top side of the PCB with the bottom side of the PCB. The second sense terminal 104 is disposed on the bottom side of the PCB 114.

Accordingly, the first sense terminal 102 and the second sense terminal 104 are disposed on opposite skies of the PCB 114. Therefore, the resistance between the first sense terminal 102 and the second sense terminal is defined by the PCB trace 106 and the through hole output pin 110 from the top side of the PCB 114 to the bottom side of the PCB 114.

Although FIG. 2 illustrates the output choke inductor 108, first sense terminal 102 and PCB trace disposed on a first side of the PCB 114, and the second sense terminal 104 disposed on a bottom side of the PCB, it should be apparent that other embodiments may include components disposed on the same side of the PCB, on different skies of the PCB with respect to one another, etc. Similarly, although FIG. 2 illustrates the output pin 110 as a through hole output pin extending through the PCB 114 from a top side to a bottom side, other embodiments may include an output pin located on a single side of the PCB.

In some embodiments, the resistance between the first sense terminal 102 and the second sense terminal 104 may include additional elements. For example, solder material may be used to couple the through hole output pin 110 to the PCB 114, the PCB trace 106, etc. The resistance between the first sense terminal 102 and the second sense terminal 104 may include the resistance of the solder material.

In some embodiments, output vias may be used to couple the through hole output pin 110 to the PCB 114, the PCB trace 106, etc. The resistance between the first sense terminal 102 and the second sense terminal 104 may include the resistance of the output vias.

In some embodiments, more than one through hole output pin 110 may be used. The resistance between the first sense terminal 102 and the second sense terminal 104 may include the resistance of the multiple through hole output pins.

Accordingly, the resistance between the first sense terminal 102 and the second sense terminal 104 may be defined by any suitable combination of the PCB trace resistance, the through hole output pin resistance, and a resistance of any additional components, materials, elements, etc. coupled to and/or between the PCB trace 106 and the through hole output pin 110.

As should be apparent, the power module 100 may be any suitable power module. For example, the power module could be a switched-mode power supply. The power module may include a high density PCB power module, a space restricted application, etc. The PCB 114 may have any suitable size such as a one-sixteenth inch thickness, a one-thirty-second inch thickness, etc. Some example dimensions for the PCB 114 may include a thirty three millimeter length, a 22.8 millimeter width, etc. As should be apparent, other PCBs may include other suitable dimensions.

The output choke inductor 108 may be any suitable choke inductor capable of reducing an output voltage ripple of the power module.

The PCB trace 106 can be any suitable PCB trace capable of conducting a current. The PCB trace 106 may be disposed on the PCB using any suitable, etching, depositing, etc. techniques. The PCB trace 106 may comprise any suitable conductor material, including but not limited to copper, etc. Similarly, the through hole output pin 110 can be any suitable conductor capable of supplying current to a load connected to the output pin. The output pin 110 may include any suitable conduct material, including but not limited to copper, etc.

The sense terminals 102 and 104 can be any suitable connectors capable of sensing a voltage at the PCB trace 106, the output pin 110, etc. For example, the sense terminals may include a PCB trace connection, a conductive terminal, etc.

Figure 3:
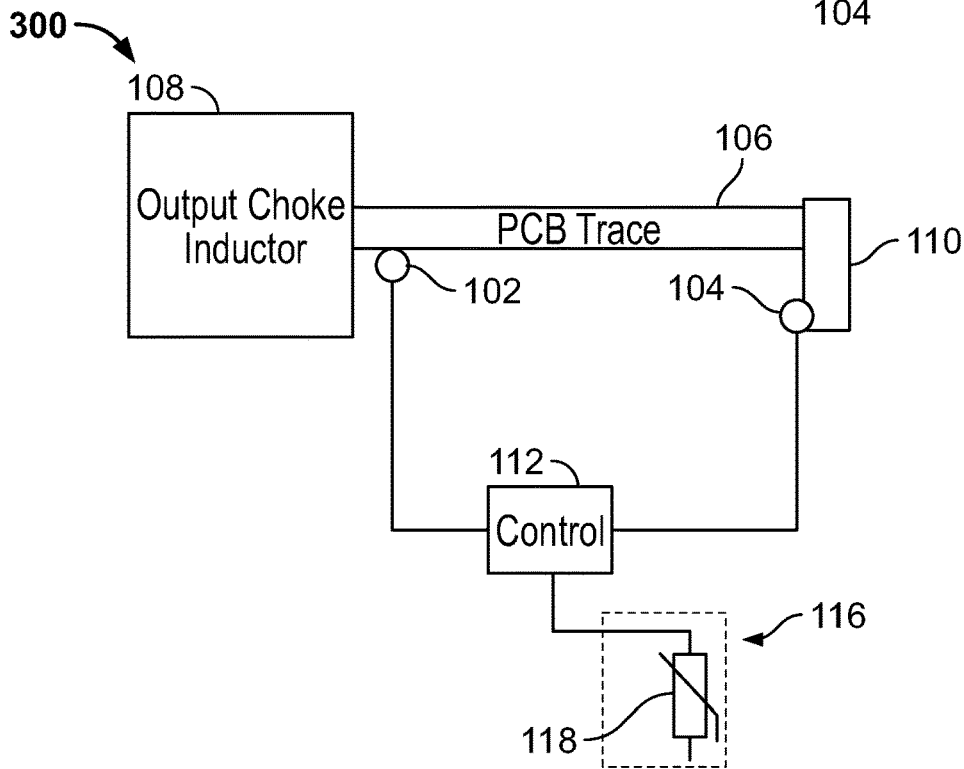
FIG. 3 is a block diagram of another example non-dissipative current sensing circuit including a temperature compensation circuit.

FIG. 3 illustrates another power module 300 according to another example embodiment of the present disclosure. The module 300 is similar to module 100 of FIG. 1, but includes a temperature compensation circuit 116 coupled to the control 112. The temperature compensation circuit 116 is adapted to measure an ambient temperature (e.g., a temperature around the compensation circuit, a temperature around the PCB trace 106, a temperature around the power module, etc.). The temperature compensation circuit 116 then adjusts an overcurrent protection threshold of the power module based on the measured ambient temperature to compensate for changes in the resistance between the first sense terminal 102 and the second sense terminal 104 based on temperature.

The control 112 may be adapted to compare the determined current through the PCB trace 106 and the output pin 110 to the adjusted overcurrent protection threshold to control operation of the power module. For example, the control 112 may adjust switching, stop switching, etc. of the power module if the measure current exceeds the adjusted over current protection threshold.

As shown in FIG. 3, the temperature compensation circuit 116 includes a thermistor 118. The thermistor 118 may be any suitable thermistor, including a negative-temperature coefficient (NTC) thermistor, etc.

Figure 4:
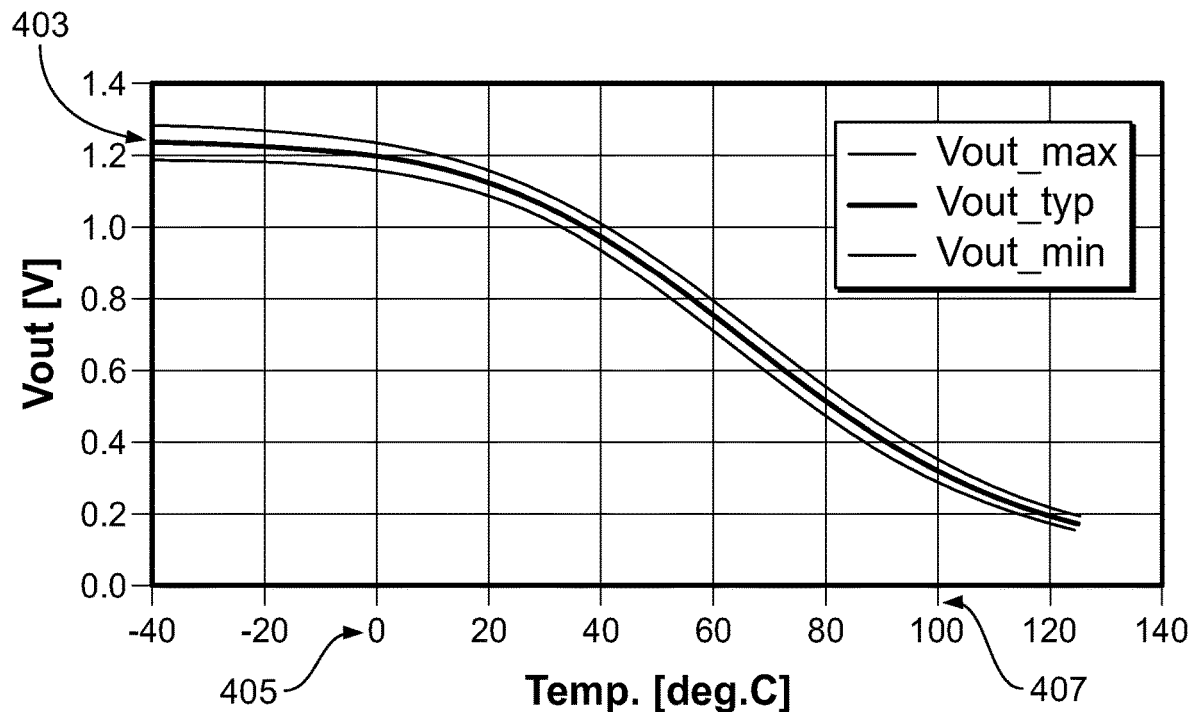
FIG. 4 is a waveform of a predefined temperature coefficient curve for adjusting an overcurrent protection threshold.

The temperature compensation circuit 116 may be adapted to adjust the overcurrent protection threshold by comparing the measured ambient temperature to a predefined temperature coefficient curve. An example predefined temperature coefficient curve 403 is illustrated in FIG. 4.

The temperature compensation circuit 116 may compare the measured ambient temperature to the temperature coefficient curve 403 to determine an adjustment value of the overcurrent protection threshold to compensate for changes in resistance between the first sense terminal 102 and the second sense terminal 104 due to variations in temperature of the PCB trace 106 and the output pin 110. For example, the temperature coefficient curve 403 may represent variations in the resistance between the first sense terminal 102 and the second sense terminal (Le., variations in the resistance of the PCB trace 106, the output pin 110, etc.) due to variations in temperature of the PCB trace 106, the output pin 110, etc.

The overcurrent protection threshold can be any suitable threshold for protecting the power module, load, etc. from conducting an amount of current that may damage the power module, load, etc. In some embodiments, the overcurrent protection threshold may be between 110% and 130% of a rated output current of the power module.

The overcurrent protection threshold may be adjusted based on the sensed temperature, then compared with the sensed output current without calibration of the sensed output current. As the temperature slowly varies, the overcurrent protection threshold can be changed slowly to keep pace with the change in temperature. In some embodiments, the overcurrent protection threshold may be changed approximately every twenty standard interrupts of the control 112.

The predefined temperature coefficient curve 403 may be divided into multiple regions. As shown in FIG. 4, the temperature coefficient curve 403 is divided into three regions. A first region includes ambient temperatures below a low temperature threshold 405, a second region includes ambient temperatures between the low temperature threshold and a high temperature threshold 407, and a third region includes ambient temperatures above the high temperature threshold.

FIG. 4 illustrates the temperature coefficient curve 403 as spanning a range from about negative forty degrees Celsius to about one hundred and twenty five degrees Celsius, having the low temperature threshold at about zero degrees Celsius and having the high temperature threshold at about one hundred degrees Celsius. It should be apparent however that other embodiments may be divided into more or less (or none) regions, may span different temperature ranges, may have different low temperature thresholds, different high temperature thresholds, etc.

Each region of the predefined temperature coefficient curve 403 may include different values for adjusting the overcurrent protection threshold. Where the measured ambient temperature has a smaller effect on the overcurrent protection threshold, a constant value may be used, the overcurrent protection threshold may be changed slowly, etc. For example, below the temperature threshold 405, the effect of temperature on the resistance of the PCB trace 106 and output pin 110 changes slowly, so a fixed minimum threshold may be used to adjust the overcurrent protection threshold. Similarly, above the high temperature threshold 407, the effect of temperature on the resistance of the PCB trace 106 and output pin 110 changes slowly, so a fixed maximum threshold may be used to adjust the overcurrent protection threshold.

In other regions where the overcurrent protection threshold changes more rapidly with variations in ambient temperature, scaled adjustments to the overcurrent protection threshold may be used. For example, between the low temperature threshold 405 and the high temperature threshold 407, the overcurrent protection threshold value may be scaled linearly with changes in the measured ambient temperature.

Different PCBs may have variations in overcurrent protection thresholds based on PCB manufacturing, assembly processes, variation in components, etc. The variations may be within about twenty percent from PCB to PCB. The variations may be automatically adjusted by trimming the base overcurrent protection threshold value. Therefore, an actual overcurrent protection threshold value may be equal to a base overcurrent protection threshold offset, plus a variable temperature compensation during operation. This calibration may allow the overcurrent protection threshold variations to be reduced despite the manufacturing, assembly, component, etc. variations. For example, the variations may be reduced to plus or minus ten percent. Dividing the temperature coefficient curve into more regions can increase the accuracy of overcurrent protection threshold adjustments.

Figure 5:
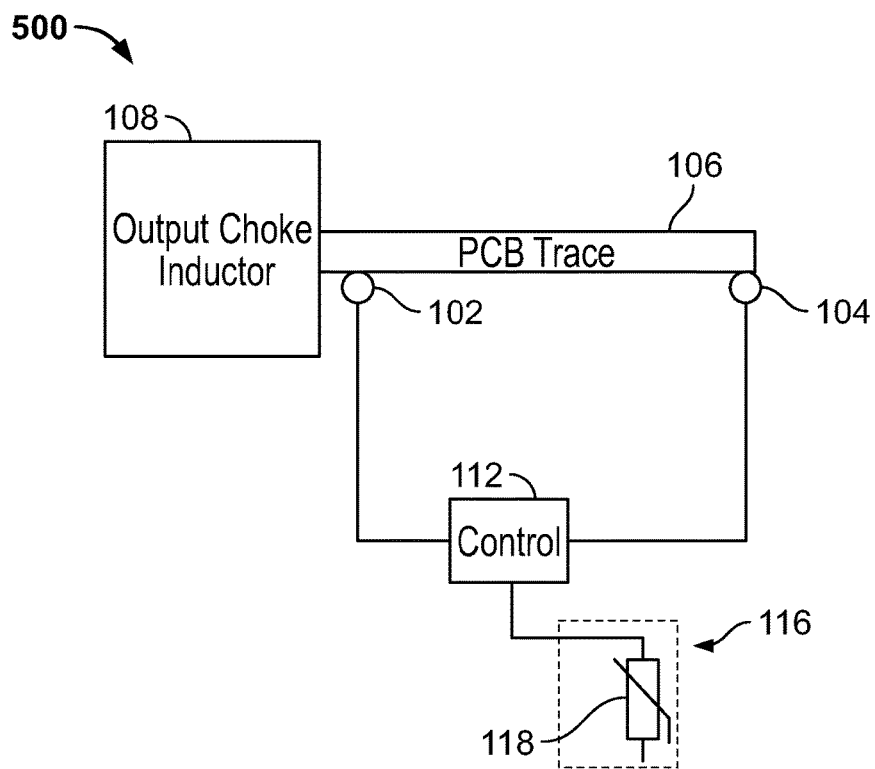
FIG. 5 is a block diagram of another example non-dissipative current sensing circuit having sense terminals coupled to a PCB trace.

FIG. 5 illustrates another power module 500 according to another example embodiment of the present disclosure. The module 500 is similar to module 100 of FIG. 1, but the second sense terminal 104 is coupled to the PCB trace 106 instead of an output pin. The second sense terminal 104 is coupled to the PCB trace 106 at an end of the PCB trace opposite the first sense terminal 102. Therefore, a resistance defined between the first sense terminal 102 and the second sense terminal 104 is defined by a resistance of the PCB trace 106.

The control 112 is adapted to measure a voltage between the first sense terminal 102 and the second sense terminal 104, and to determine a current through the PCB trace 106 based on the measured voltage and the resistance between the first sense terminal and the second sense terminal.

The module 500 also includes a temperature compensation circuit 116 coupled to the control 112. The temperature compensation circuit 116 is adapted to measure an ambient temperature and adjust an overcurrent protection threshold of the power module based on the measured ambient temperature to compensate for changes in the resistance between the first sense terminal 102 and the second sense terminal 104 based on temperature.

The control 112 may be adapted to compare the determined current through the PCB trace 106 to the adjusted overcurrent protection threshold to control operation of the power module.

The temperature compensation circuit 116 may include a thermistor 118. The thermistor 118 can be any suitable thermistor, including but not limited to an NTC thermistor, etc.

Figure 6:
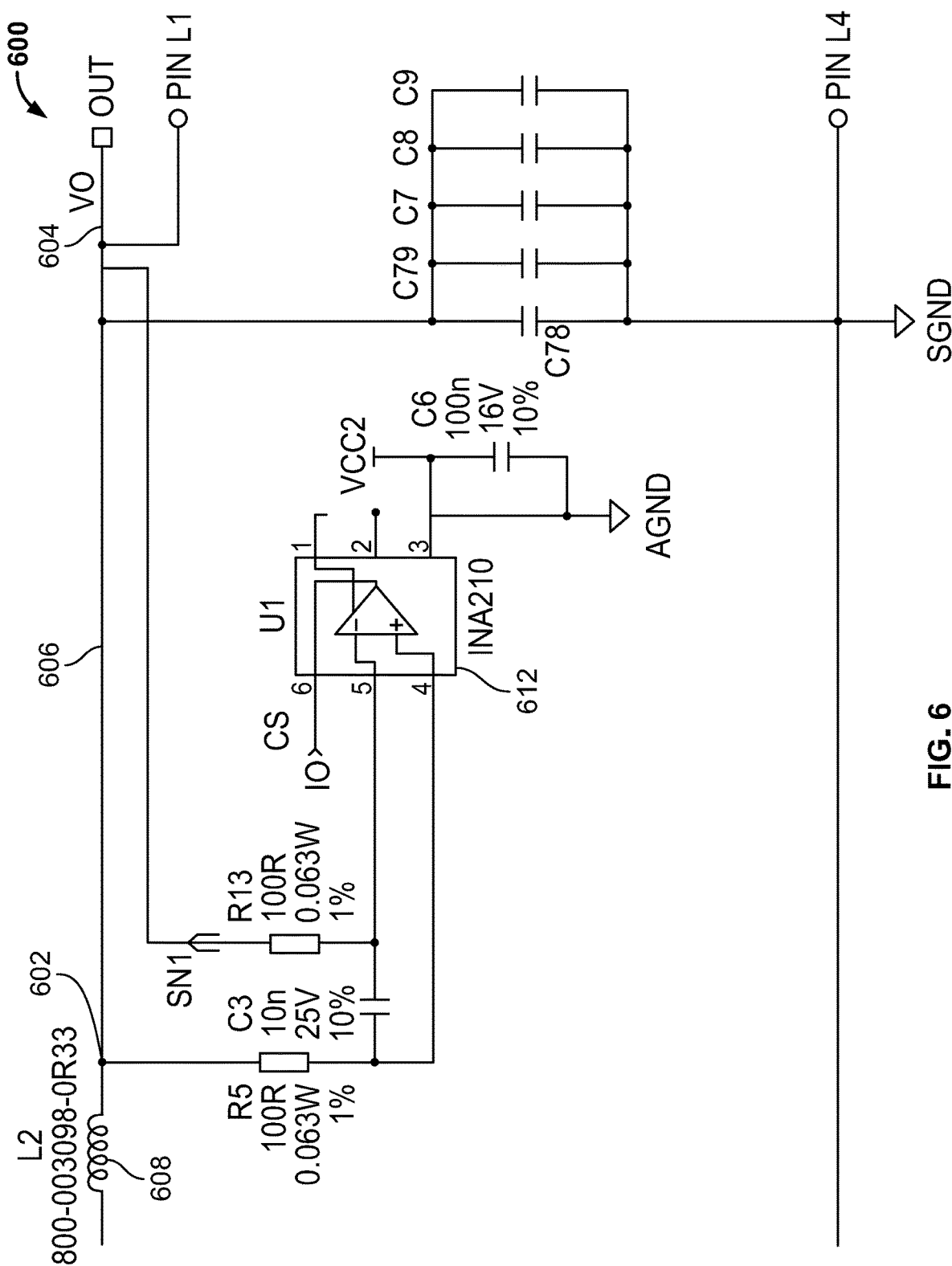
FIG. 6 is a circuit diagram of another example non-dissipative current sensing circuit, according to another embodiment of the present disclosure.

FIG. 6 illustrates a wiring diagram of an example power module 600, according to another example embodiment of the present disclosure. The module 600 includes a first sense terminal 602 and a second sense terminal 604 coupled about a PCB trace 606. The module 600 also includes an output choke inductor 608.

Control 612 is adapted to measure a voltage between the first sense terminal 602 and the second sense terminal 604, and to determine a current through the output choke inductor 608 based on the measured voltage and a resistance between the first sense terminal and the second sense terminal. For example, resistor R5, capacitor C3, and resistor R13 are coupled between the first sense terminal 602 and the second sense terminal 604. The control 612 is coupled to the capacitor C3 to measure a voltage across the capacitor C3, corresponding to a voltage between the first sense terminal 602 and the second sense terminal 604.

The example component values, tolerances, etc. illustrated in FIG. 6 are included for purposes of illustration only, and it should be apparent that other suitable components values, tolerances, etc. can be uses without departing from the scope of the present disclosure.

Figure 7:
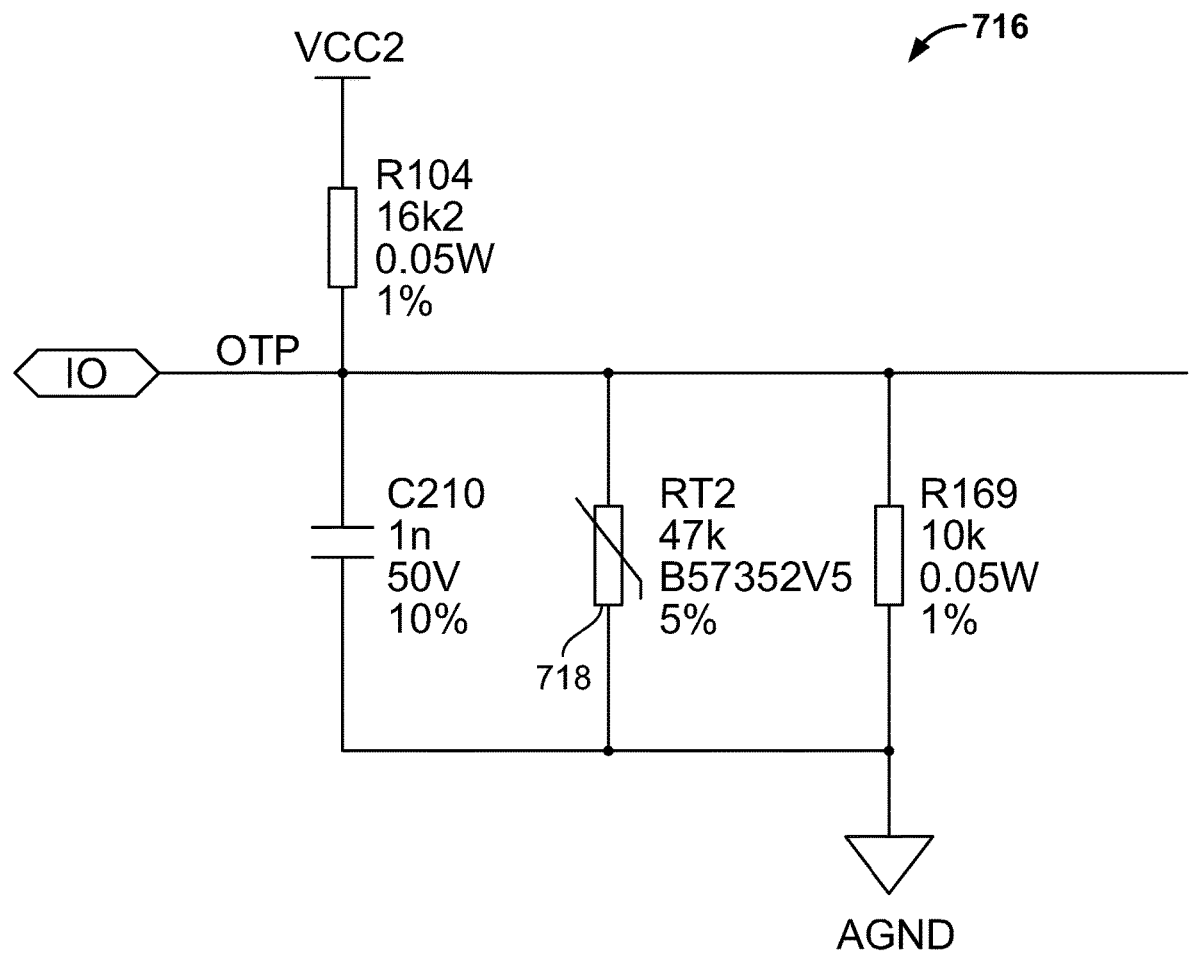
FIG. 7 is a circuit diagram of an example temperature compensation circuit, according to another embodiment of the present disclosure.

FIG. 7 illustrates a wiring diagram of an example temperature compensation circuit 716, according to another example embodiment of the present disclosure. The temperature compensation circuit 716 includes a negative temperature coefficient thermistor 718.

The temperature compensation circuit 716 is adapted to measure an ambient temperature for adjusting an overcurrent protection threshold of a power module. For example, the temperature compensation circuit 716 may be coupled to the control 612 of FIG. 6, such that the control can modify operation of a power module based on the determined current between sense terminal 602 and sense terminal 604 and the measured ambient temperature and adjusted overcurrent protection threshold from temperature compensation circuit 716.

The example component values, tolerances, etc. illustrated in FIG. 7 are included for purposes of illustration only, and it should be apparent that other suitable components values, tolerances, etc. can be uses without departing from the scope of the present disclosure.

In another embodiment, a method of sensing current using a current sensing circuit is disclosed. The current sensing circuit includes a first sense terminal coupled to a printed circuit board (PCB) trace on a PCB of a power module. The PCB trace is coupled to an output choke inductor mounted to the PCB. A second sense terminal is coupled to at least one output pin of the power module. The output pin is connected to the PCB trace such that a resistance between the first sense terminal and the second sense terminal is defined by the resistance of the PCB trace and the resistance of the output pin. The method generally includes measuring a voltage between the first sense terminal and the second sense terminal, and determining a current through the PCB trace and the output pin based on the measured voltage and the resistance between the first sense terminal and the second sense terminal. The method also includes measuring an ambient temperature of the power module, and adjusting an overcurrent protection threshold of the power module based on the measured ambient temperature to compensate for changes in the resistance between the first sense terminal and the second sense terminal based on temperature.

The method may also include comparing the determined current through the PCB trace and the output pin to the adjusted overcurrent protection threshold to control operation of the power module.

In some embodiments, the first side of the PCB is a top side of the PCB, and the second side of the PCB is a bottom side of the PCB opposite the top side of the PCB, and the output pin includes a through hole output pin connecting the top side of the PCB to the bottom side of the PCB. A solder material may be soldered to the output pin, such that the resistance defined between the first sense terminal and the second sense terminal further includes the resistance of the solder material.

Adjusting the overcurrent protection threshold may include comparing the measured ambient temperature to a predefined temperature coefficient curve. The temperature coefficient curve may include at least three separately defined regions.

Comparing the measured ambient temperature to a predefined temperature coefficient curve may include linearly scaling the overcurrent protection threshold when the measured ambient temperature is between a low temperature threshold and a high temperature threshold. Comparing the measured ambient temperature to the predefined temperature coefficient curve may include selecting a minimum overcurrent protection threshold value when the measured ambient temperature is below the low temperature threshold. Comparing the measured ambient temperature to the predefined temperature coefficient curve may include selecting a maximum overcurrent protection threshold value when the measured ambient temperature is above the high temperature threshold.

Any of the example embodiments and aspects disclosed herein may be used in any suitable combination with any other example embodiments and aspects disclosed herein without departing from the scope of the present disclosure. For example, current sensing circuits and temperature compensation circuits described herein may implement other sensing methods, the sensing methods described herein may be implemented in other current sensing circuits, temperature compensation circuits, etc. without departing from the scope of the present disclosure.

Any of the controls, circuits, methods, etc. described herein may be configured, adapted, etc. according to any suitable hardware and/or software implementations. For example, the controls, circuits, etc. may include a microprocessor, digital signal processor, etc. configured to execute computer-executable instructions stored in memory on a processor, may include logic circuitry, etc. adapted to perform one or more instructions, etc.

Example embodiments and aspects of the present disclosure may provide any of the following advantages, including but not limited to: simplified circuit design, simplified power module design, reduced cost, reduced component count, increased power module efficiency, higher power module density, increase PCB space availability, elimination of a shunt sensing resistor, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A power module comprising:
a printed circuit board (PCB) having a PCB trace;
a first sense terminal coupled to the PCB trace at a first location;
a second sense terminal coupled to the PCB trace at a second location distinct from the first location such that a resistance between the first sense terminal and the second sense terminal is defined by a resistance of the PCB trace between the first location and the second location; and
a control coupled to the first sense terminal and the second sense terminal, the control adapted to:
measure a voltage between the first sense terminal and the second sense terminal; and
determine a current through the PCB trace based on the measured voltage and the resistance between the first sense terminal and the second sense terminal.

2. The module of claim 1, wherein the first sense terminal is disposed on a first side of the PCB, and the second sense terminal is disposed on a second side of the PCB.

3. The module of claim 2, wherein the first side of the PCB is a top side of the PCB, and the second side of the PCB is a bottom side of the PCB opposite the top side of the PCB.

4. The module of claim 1, further comprising an output pin coupled to the PCB;
wherein the PCB trace is coupled between the first sense terminal and the output pin;
wherein the second location is located on the output pin; and
wherein the resistance between the first sense terminal and the second sense terminal is further includes a resistance of the output pin.

5. The module of claim 4, wherein the output pin includes a through hole output pin connecting a top side of the PCB to a bottom side of the PCB.

6. The module of claim 4, further comprising a solder material soldered to the output pin, such that the resistance defined between the first sense terminal and the second sense terminal further includes the resistance of the solder material.

7. The module of claim 1, further comprising a temperature compensation circuit coupled to the control, the temperature compensation circuit adapted to:
measure an ambient temperature; and
adjust an overcurrent protection threshold of the power module based on the measured ambient temperature to compensate for changes in the resistance between the first sense terminal and the second sense terminal based on temperature.

8. The module of claim 7, wherein the control is adapted to compare the determined current through the PCB trace to the adjusted overcurrent protection threshold to control operation of the power module.

9. The module of claim 7, wherein the temperature compensation circuit is adapted to adjust the overcurrent protection threshold by comparing the measured ambient temperature to a predefined temperature coefficient curve.

10. The module of claim 1, further comprising an output choke inductor mounted to the PCB and coupled to the PCB trace; and
wherein the current through the PCB trace comprises a current through the output choke inductor.

11. A power module comprising:
a printed circuit board (PCB) having a PCB trace;
a first sense terminal coupled to a first location of the PCB trace;
a second sense terminal coupled to a second location of the PCB trace such that a resistance between the first sense terminal and the second sense terminal is defined by a resistance of the PCB trace;
a control coupled to the first sense terminal and the second sense terminal, the control adapted to determine a current through the PCB trace based on a measured voltage between the first sense terminal and the second sense terminal and based on the resistance between the first sense terminal and the second sense terminal; and a temperature compensation circuit coupled to the control, the temperature compensation circuit adapted to adjust an overcurrent protection threshold of the power module based on a measured ambient temperature to compensate for changes in the resistance between the first sense terminal and the second sense terminal based on temperature.

12. The module of claim 11, wherein the control is further adapted to compare the determined current through PCB trace to the adjusted overcurrent protection threshold to control operation of the power module.

13. The module of claim 11, wherein the control is further adapted to measure the voltage between the first sense terminal and the second sense terminal; and
wherein the temperature compensation circuit is further adapted to measure the ambient temperature.

14. The module of claim 11, further comprising an output choke inductor mounted to the PCB and coupled to the PCB trace; and
wherein the first location is adjacent to the output choke inductor.

15. A method of sensing a current sensing using a current sensing circuit, the current sensing circuit having a first sense terminal coupled to a printed circuit board (PCB) trace on a PCB of a power module and having a second sense terminal coupled to the PCB trace such that a resistance between the first sense terminal and the second sense terminal is defined by the resistance of the PCB trace, the method comprising:
measuring a voltage between the first sense terminal and the second sense terminal;
determining a current through the PCB trace based on the measured voltage and the resistance between the first sense terminal and the second sense terminal.

16. The method of claim 15, further comprising measuring an ambient temperature of the power module; and
adjusting an overcurrent protection threshold of the power module based on the measured ambient temperature to compensate for changes in the resistance between the first sense terminal and the second sense terminal based on temperature.

17. The method of claim 15, further comprising comparing the determined current through the PCB trace to the adjusted overcurrent protection threshold to control operation of the power module.

18. The method of claim 15, wherein the power module further comprises an output pin connected to the PCB and coupled to the second sense terminal; and
wherein the resistance defined between the first sense terminal and the second sense terminal further includes a resistance of the output pin.

19. The method of claim 18, wherein a first side of the PCB is a top side of the PCB;
wherein a second side of the PCB is a bottom side of the PCB opposite the top side of the PCB; and
wherein the output pin includes a through hole output pin connecting the top side of the PCB to the bottom side of the PCB.

20. The method of claim 18, further comprising a solder material soldered to the output pin; and
wherein the resistance defined between the first sense terminal and the second sense terminal further includes a resistance of the solder material.

* * * * *